US006277436B1

(12) United States Patent
Stauf et al.

(10) Patent No.: US 6,277,436 B1
(45) Date of Patent: Aug. 21, 2001

(54) LIQUID DELIVERY MOCVD PROCESS FOR DEPOSITION OF HIGH FREQUENCY DIELECTRIC MATERIALS

(75) Inventors: Gregory T. Stauf, New Milford; Jeffrey F. Roeder, Brookfield; Thomas H. Baum, New Fairfield, all of CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/216,673

(22) Filed: Dec. 18, 1998

Related U.S. Application Data

(63) Continuation-in-part of application No. 08/979,684, filed on Nov. 26, 1997, now Pat. No. 5,932,905.

(51) Int. Cl.$^7$ .............................. C23C 16/40; C23C 16/18
(52) U.S. Cl. ................................. 427/126.3; 427/255.31; 427/255.32; 427/255.36; 427/564
(58) Field of Search .................. 427/255.31, 255.32, 427/255.36, 100, 126.3

(56) References Cited

U.S. PATENT DOCUMENTS

| | | |
|---|---|---|
| 3,938,064 | 2/1976 | O'Bryan, Jr. et al. . |
| 4,337,446 | 6/1982 | O'Bryan, Jr. et al. . |
| 4,563,661 | 1/1986 | O'Bryan, Jr. et al. . |
| 5,204,314 | 4/1993 | Kirlin et al. . |
| 5,453,494 * | 9/1995 | Kirlin et al. ......................... 534/15 |
| 5,536,323 | 7/1996 | Kirlin et al. . |
| 5,635,420 | 6/1997 | Nishioka . |
| 5,645,634 | 7/1997 | Ogi et al. . |
| 5,653,806 | 8/1997 | Van Buskirk et al. . |
| 5,711,816 | 1/1998 | Kirlin et al. . |
| 5,741,363 | 4/1998 | Van Buskirk . |
| 5,820,664 * | 10/1998 | Gardiner et al. ............... 106/287.17 |
| 5,850,664 | 10/1998 | Gardiner et al. . |
| 5,876,503 * | 3/1999 | Roeder et al. ..................... 118/715 |
| 5,919,522 * | 7/1999 | Baum et al. ..................... 427/248.1 |
| 5,980,983 * | 11/1999 | Gordon ............................... 427/226 |
| 6,010,969 * | 1/2000 | Vaartstra ............................ 438/758 |

OTHER PUBLICATIONS

S.M. Bilodeau et al., "MOCVD BaSrTiO3 for $\geq$ 1–Gbit DRAMs" Solid State Technology, Jul. 1997, p. 235–242.

T. Negas, etal., "BaTi$_4$O$_9$/Ba$_2$Ti$_9$O$_{20}$–based Ceramics Resurrected for Modern Microwave Applications", Am. Cer. Soc. Bull., 72(1) 1993, p. 80–89.

H.M. O'Bryan et al, "Growth and characterization of thin film dielectrics for microwave applications" Integrated Ferroelectrics, vol. 15, 1997, p. 155–159.

(List continued on next page.)

Primary Examiner—Shrive Beck
Assistant Examiner—Bret Chen
(74) Attorney, Agent, or Firm—Steven J. Hultquist; Robert A. McLauchlan; Oliver A. M. Zitzmann

(57) ABSTRACT

A liquid delivery MOCVD method for deposition of dielectric materials such as (Ba,Sr) titanates and (Zr,Sn) titanates, in which metal source compounds are dissolved or suspended in solvent and flash vaporized at temperatures of from about 100° C. to about 300° C. and carried via a carrier gas such as argon, nitrogen, helium, ammonia or the like, into a chemical vapor deposition reactor wherein the precursor vapor is mixed with an oxidizing co-reactant gas such as oxygen, ozone, N$_2$O, etc., to deposit the high dielectric metal oxide film on the substrate at a temperature of from about 400° C. to about 1200° C. at a chemical vapor deposition chamber pressure of from about 0.1 torr to about 760 torr. Such process may for example be employed to form a (Ba,Sr) titanate dielectric material wherein at least 60 atomic % of the total metal content of the oxide is titanium. The high dielectric material of the invention may be used to form capacitive microelectronic device structures for applications such as dynamic random access memories and high frequency capacitors.

26 Claims, 7 Drawing Sheets

OTHER PUBLICATIONS

S.B. Turnipseed et al, "Synthesis and characterization of alkaline earth metal beta–diketonate complexes used as precursors for chemical vapor deposition of thin film semiconductor" Inorganic Chemistry, vol. 30, p. 1164–1170 (1991).

P. Kirlin et al, "MOCVD of BaSrTiO$_3$ for ULSI DRAMS" Integrated Ferroelectrics, vol. 7, p. 307–318 (1995).

H.M. O'Bryan et al, "Growth and characterization of thin film dielectrics for microwave applications" Integrated Ferroelectrics, vol. 15, p. 155–162 (1997).

S.M. Sze, VLSI Technology, Chap. 11 & Chap. 12, pp. 445–549.

J.L. McCreary, "Matching Properties abd Voltage and Temperature Dependence of MOS Capacitors" IEEE J of Solid–State Circuits, vol. SC–16, No. 6, pp. 608–616, Dec. 1981.

Q.X. Jia et al, "BaTiO$_3$ Thin film capacitors deposited by R.F. Magnetron Sputtering," Thin Solid Films, pp. 230–239 (1992).

T. Horikawa et al., "Dielectric Properties of (Ba, Sr) TiO$_3$ Thin films deposited by RF Sputtering" Japan J. Appl. Phys., vol. 32, Part 1, No. 9B, pp. 4126–4130 (Sep. 1993).

H. M. O'Bryan et al., "A New BaO–TiO$_2$ Compound with Temperature–Stable High Permittivity and Low Microwave Loss", J. Am. Ceram. Soc. 57(10), 1974, p. 450.

D.F. Rushman et al., Trans Faraday Soc. A 42, 1946, p. 231–238.

S.G. Mhaisalkar et al., "Microwave Dielectric Properties of Doped BaTi$_4$O$_9$" J. Am. Ceram. Soc., 74(8), 1991, p. 1894–1898.

G. T. Stauf et al., "BaSrTiO3 thin films for integrated high frequency capacitors" Proceedings of ISAF 96 Rutgers Univ., Aug. 18–21 1996 no pages.

G. T. Stauf et al., "Thin Film High K Dielectrics for Integrated Passive Devices" Proceedings of the 29$^{th}$ ISHM conference, Minneapolis, MN, Oct. 6–10, 1996, pp. 349–354.

* cited by examiner-

LIQUID DELIVERY MOCVD PROCESS FOR DEPOSITION OF HIGH FREQUENCY DIELECTRIC MATERIALS

CROSS-REFERENCE TO RELATED APPLICATION

This is a continuation-in-part of U.S. patent application Ser. No. 08/979,684 filed Nov. 26, 1997 now U.S. Pat. No. 5,932,905 in the names of H. M. O'Brien, Jr. et al., for "Article Comprising a Sr—Ba—Ti-Oxide Dielectric Thin Film and Method of Making Same."

GOVERNMENT RIGHTS IN INVENTION

This invention was made with Government support under Contract No. F33615-94-C-2508. The Government has certain rights in this invention.

BACKGROUND OF THE INVENTION

1. Field of the Invention

This invention relates to a liquid delivery MOCVD process for deposition of high frequency dielectric material on a substrate. This invention also pertains in other aspects to capacitors utilizing a Ba—Sr—Ti-oxide dielectric material, to integrated circuit chips comprising such capacitors, and to a method of making such capacitors.

2. Description of the Related Art

High quality dielectric films possess numerous properties of technological importance, including dielectric constant, low loss of electrical characteristics, e.g., low electrical leakage character, and robustness in applications such as formation of capacitive structures for devices useful in wireless communications.

Examples of materials useful in forming such high quality dielectric films include barium titanates, barium-strontium titanates, and $(Zr,Sn)TiO_4$.

In these dielectric material systems, precise and repeatable compositional control is required to produce reliable films of the desired quality. Physical deposition methods (e.g., sputtering, evaporation, etc.) to fabricate thin films are deficient in this respect, as are traditional approaches to metal-organic chemical vapor deposition (MOCVD) involving the use of bubblers. Chemical vapor deposition (CVD) is a particularly attractive method for forming high quality dielectric film layers because it is readily scaled up to production runs and because the electronic industry has a wide experience and an established equipment base in the use of CVD technology which can be applied in new CVD processes. In general, the control of key variables such as stoichiometry and film thickness, and the coating of a wide variety of substrate geometries is possible with CVD. Forming of thin films by CVD permits the integration of the film materials into existing device production technologies. CVD also permits the formation of layers of refractory materials that are epitaxially related to substrates having close crystal structures.

CVD requires however that the element source reagents, i.e., the precursor compounds and complexes containing the elements or components of interest, must be sufficiently volatile to permit gas phase transport into the chemical vapor deposition reactor. The elemental component source reagent must decompose in the CVD reactor to deposit only the desired element or components at the desired growth temperatures. Premature gas phase reactions leading to particulate formation must not occur, nor should the source reagent decompose in the lines before reaching the reactor deposition chamber. When compounds are desired to be deposited, obtaining optimal properties requires close control of stoichiometry which can best be achieved if the reagent can be delivered into the reactor in a controllable fashion. In this respect the reagents must not be so chemically stable that they are non-reactive in the deposition chamber.

Desirable CVD reagents therefore are fairly reactive and volatile. Unfortunately, for many of the high dielectric film materials described hereinabove, volatile reagents do not exist. Many potentially highly useful refractory materials have in common that one or more of their components are elements, i.e., the Group II metals barium, calcium, and strontium, as well as the early transition metals zirconium and hafnium, for which no or few volatile compounds well-suited for CVD are known. In many cases, the source reagents are solids whose sublimation temperatures may be very close to the decomposition temperature, in which case the reagent may begin to decompose in the lines before reaching the reactor, and it is consequently very difficult to control the stoichiometry of the deposited films from such decomposition-susceptible reagents.

In other cases, the CVD reagents may be liquids, but their delivery into the CVD reactor in the vapor phase is impractical due to problems of premature decomposition or stoichiometric control.

In multicomponent films such as high dielectric films, the constituent elements may form films with a wide range of stoichiometrics. In such film applications, the controlled delivery of known proportions of the source reagents into the CVD reactor chamber is essential to the achievement of suitable product films and microelectronic device structures.

While source reagent liquid delivery systems afford potential advantages over conventional techniques, there often is some fraction of the precursor composition that decomposes into very low volatility compounds that remain in the vaporization zone, when the precursor reagent is furnished in a liquid form.

In liquid delivery MOCVD, the precursor is dissolved or suspended in a liquid medium which is vaporized, and the resulting precursor vapor is passed to the chemical vapor deposition chamber. The problems attendant the use of such technique for film formation of high quality dielectric films includes the fact that virtually all solid and liquid precursors undergo some decomposition when heated for conversion to the gas phase, in the vaporization step, although this fraction is typically small for "well-behaved" compounds.

Additionally, CVD precursors often contain impurity species, and the presence of such species can cause undesirable thermally activated chemical reactions in the vaporization zone, also resulting in the formation of involatile solids and liquids at that location. Extraneous by-products may therefore be generated in the vaporization zone and pass to the deposition chamber, where they are undesirably incorporated into the growing dielectric film, with consequent adverse affect on the product film quality and character.

Despite the advantages of the liquid delivery approach, the foregoing deficiencies pose a serious impediment to the widespread use of the liquid delivery technique for providing volatilized reagents and forming high quality dielectric films.

Relating the foregoing to specific applications, it would be desirable if MOCVD could be efficiently utilized for the fabrication of capacitor structures employing high dielectric constant material, in applications such as communication circuits and other high-frequency circuits where discrete capacitors are typically used. It would also be desirable if thin film capacitors could be used instead of discrete ones, especially if the former could be integrated with the circuitry on an IC chip.

Among the (actual or potential) applications for integrated capacitors of the foregoing type are dynamic random access memory (DRAM) storage capacitors, feedthrough capacitors, bypass capacitors, capacitors for resistance-capacitance (RC) filters, and capacitors for switched capacitor filters. For DRAM storage capacitors, large specific capacitance and low leakage current are important requirements. For the other identified applications, large specific capacitance is also important, although it generally need not be as large as for DRAM applications. Among other important considerations for capacitors for non-DRAM applications are the achievement of low leakage current, high breakdown field, small loss tangent (or large quality factor), and small variation of capacitance with temperature. At least for those applications that require very low harmonic distortion or intermodulation distortion, low dependence of the capacitance on the applied voltage is very important.

It has recently been established that thin film capacitors with perovskite $Ba_{1-x}Sr_xTiO_3$ dielectric can attain high specific capacitance characteristics. However, such capacitors have relatively large voltage dependence of the dielectric constant k that makes them unsuitable for some important applications.

Recently it was also discovered that capacitors with a non-perovskite dielectric of the composition $Ba_2Ti_9O_{20}$ could be fabricated, having a low dependence of capacitance on the applied voltage. There are several closely related phases of Ba—Ti—O containing material with similar properties, and any ceramic or thin film is likely to contain a mixture of these phases, as well as (in the case of a thin film) possibly amorphous components. Therefore, in the ensuing description, this material is referred to as $Ba_2Ti_9O_{20}$, with the understanding that it may be a more complex mixture of phases. In the case where Sr is added, the designation $(Ba,Sr)Ti_9O_{20}$ will be used, again with the understanding that composition will vary, as described hereinafter, over a wider range of stoichiometries than that indicated by the subscripts used.

Typically, the quadratic coefficient $a_2$ for such non-perovskite materials is less than 100 ppm/$V^2$. The coefficients $a_1$ and $a_2$ are defined by the expression $\Delta C/C = a_1 V + a_2 V^2$, wherein C is capacitance, $\Delta C$ is the change in capacitance, and V is applied voltage. The linear term $a_1$ can be cancelled by means of a differential circuit, but the quadratic term $a_2$ has to be minimized by appropriate choice of material of construction. Capacitors with $Ba_2Ti_9O_{20}$ dielectric have relatively low specific capacitance, typically only about 5% of that of the perovskite $Ba_{1-x}Sr_xTiO_3$.

It clearly would be desirable to have available integrated capacitors with a low voltage dependence characteristic for k, comparable to that of non-perovskite $Ba_2Ti_9O_{20}$ (i.e., $a_2 < 100$ ppm$_V^2$), and with higher k (and thus with higher specific capacitance) than is attainable with $Ba_2Ti_9O_{20}$ (e.g., k greater than 40).

Accordingly, it is an object of the present invention to provide an improved liquid delivery chemical vapor deposition process for the formation of high quality dielectric films on substrates.

It is another object of the present invention to provide integrated capacitors comprising high quality dielectric films of such type, for use in applications such as switched capacitor filters (SCF) and other applications requiring capacitors with relatively high specific capacitance and low voltage dependence of the dielectric constant.

Other objects and advantages of the present invention will be more fully apparent from the ensuing disclosure and appended claims.

SUMMARY OF THE INVENTION

In a broad aspect, the present invention relates to a liquid delivery metalorganic chemical vapor deposition process, in which a film, e.g., of a (Zr, Sn) titanate, or of a, high Ti (Ba, Sr) titanate, is formed on a substrate. In such process, one or more metalorganic precursors for each of the metal components is dissolved or suspended in a solvent medium to form a precursor solution or suspension ("precursor solution"). The precursor solution is flash vaporized at a temperature of from about 100° C. to about 300° C. to form a resulting precursor vapor. The precursor vapor is carried into the chemical vapor deposition reactor by a carrier gas that is selected to be non-deleterious to the chemical vapor deposition operation, such as argon, nitrogen, helium, ammonia, etc. The precursor vapor and carrier gas mixture are mixed in the chemical vapor deposition reactor with an oxidizing co-reactant gas such as $O_2$, $N_2$, O, $O_3$, etc. The precursor vapor in the chemical vapor deposition reactor undergoes decomposition at a substrate under chemical vapor deposition conditions including a temperature from about 400° C. to about 1200° C., and a pressure in the chemical vapor deposition reactor of from about 0.1 torr to about 760 torr.

In a particular embodiment, the oxidizing co-reactant gas may be constituted by an oxidizing species formed by a remote plasma source, to reduce deposition temperature conditions required in the chemical vapor deposition reactor, relative to those otherwise required if the film were simply deposited and subsequently oxidized to incorporate oxygen into the film.

In another aspect, the invention relates to an article (e.g., an integrated circuit chip) that comprises an improved thin film capacitor disposed on a substrate. The capacitor comprises a first and a second electrode, with a thin film of oxide dielectric material disposed between the electrodes.

The metal titanate in one aspect of the invention comprises a (Zr,Sn) titanate and the metal titanate film is a dielectric element of a high frequency capacitor, wherein the (Zr,Sn) titanate has the formula: $Zr_{1-x}Sn_xTiO_4$ in which x is from 0 to about 0.3. Preferably, x is greater than 0 and does not exceed about 0.3.

The metal titanate in another aspect of the invention comprises a (Zr,Sn) titanate and the metal titanate film is a dielectric element of a dynamic random access memory device, wherein the (Zr,Sn) titanate has the formula: $Zr_x$, $Sn_yTi_zO_{4-\delta}$ in which x is fiom about 0.1 to about 0.45, y is from 0 to about 0.6, z is from about 0.3 to about 0.6, and $\delta = (x+y+z)$. Preferably, y is greater than 0.

The dielectric in accordance with a preferred aspect of the invention comprises Ba—Sr—Ti—O, wherein at least 60 atom % of the total metal content is Ti. The oxide is therefore of a "titanium-rich" character, and has a dielectric constant k>40 and a second order voltage coefficient $a_2 < 100$ ppm/$V^2$, both as measured at 20° C.

The invention relates in another aspect to a method of making an article including an integrated capacitor (i.e., a thin film capacitor). Such method comprises providing a substrate, forming a first electrode on the substrate, and depositing on the first electrode a layer of Ba—Sr—Ti—O with at least 60 atom % (of the total metal content) being Ti.

After attainment of the desired oxide thickness a second electrode is formed on the oxide.

In one preferred embodiment of the invention, the oxide deposition conditions are selected such that the oxide is high Ti (Ba,Sr) titanate. In the (Ba,Sr) titanates of the invention, Ba, Sr and Ti together typically comprise at least 99 atomic percent of the total metal content of such dielectric material. The oxygen content typically depends on the metal ion content and frequently exceeds 60% of the total number of atoms of the material.

Various additional aspects, feature and embodiments of the invention will be more fully apparent from the ensuing disclosure and appended claims.

DETAILED DESCRIPTION OF THE INVENTION, AND PREFERRED EMBODIMENTS THEREOF

Figure 1:
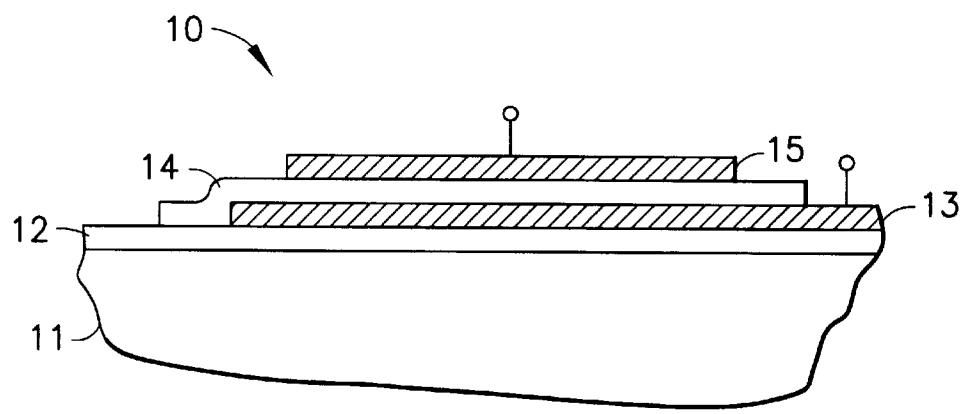
FIG. 1 schematically depicts an illustrative device structure according to one embodiment of the present invention.

The disclosures of all U.S. Patent Applications hereinafter incorporated by reference are commonly assigned to the assignee hereof, Advanced Technology Materials, Inc.

The present invention is based on the discovery that high quality dielectric films may be efficiently formed by liquid delivery metal-organic chemical vapor deposition under specific process conditions, thereby obviating the stoichiometric and compositional control deficiencies of prior art approaches, and the film quality deficiencies of the prior art.

The present invention contemplates the liquid delivery metal-organic chemical vapor deposition formation of films such as Ba—Sr—Ti—O, e.g., high Ti (Ba, Sr) titanate, etc., and (Zr, Sn) titanates, e.g., (Zr, Sn) TiO4, wherein the respective applicable barium, strontium, zirconium, tin and titanium precursors are dissolved in compatible solvent media and flash vaporized at temperatures in the range of from about 100° C. to about 300° C. to form a corresponding precursor vapor. As used herein, the term "Ba—Sr—Ti—O" refers to any mixture of Ba, Sr and Ti oxides and "high Ti (Ba, Sr) titanate" refers to an oxide having a nominal composition $(Ba_xSr_yTi_{1-x-y})$-oxide, wherein 1–x–y is in the range of from about 0.65 to about 0.90 and wherein both x and y greater than or equal to 0.05.

The specific metalorganic compounds and solvent media utilized to form the precursor solution for flash vaporization include those more fully described in allowed U.S. patent application Ser. No. 08/414,504 filed Mar. 31, 1995 in the names of Robin Gardiner et al. for "Precursor Compositions for Chemical and Vapor Deposition, and Ligand Exchange Resistant Metal-Organic Precursor Solutions Comprising Same," the disclosure of which hereby is incorporated herein by reference in its entirety, as well as U.S. patent application Ser. No. 08/484,654 filed Jun. 7, 1995 in the names of Robin A. Gardiner et al. for "Method of Forming Metal Films on a Substrate by Chemical Vapor Deposition," and U.S. patent application Ser. No. 08/975,372 filed Nov. 20, 1997 in the names of Thomas H. Baum et al. for "Alkane and Polyamine Solvent Composition for Liquid Delivery Chemical Vapor Deposition," the disclosures of which likewise are incorporated herein by reference in their entireties.

The precursors may comprise metalorganic species such as β-diketonates, β-ketoiminates, β-diiminates, alkanes, alkenes, cycloalkenes, aryl compounds, alkoxides, and fluorinated derivatives thereof. The precursor metal species may be provided as metal coordination complexes in which the metal coordination atom is coordinatively bound in a stable complex to two or more ligands of such type, wherein the ligands may be the same as or different from one another, as more fully described in the aforementioned incorporated by reference U.S. patent applications.

The solvent utilized in the precursor solutions may be of any suitable type which is compatible with and solubilizing or suspending in relation to the metalorganic compound or complex employed in the solution. Illustrative of solvents which may be utilized in the broad practice of the present invention are glymes, aliphatic hydrocarbons, aromatic hydrocarbons, organic ethers, organic esters, alkyl nitriles, alkanols, organic amines, and polyamines.

Specific types of solvents may include: glyme solvents having from 1 to 20 ethoxy repeating units, $C_2$–$C_{12}$ alkanols, organic ethers selected from the group consisting of dialkyl ethers comprising $C_1$–$C_6$ alkyl moieties, $C_4$–$C_8$ cyclic ethers, $C_8$–$C_{40}$ crown, $O_1$–$O_{20}$ ethers wherein the prefixed $C_i$ range is the number of carbon atoms in the ether compound and the suffixed $O_i$ range is the number of oxygen atoms in the ether compound, $C_6$–$C_{12}$ aliphatic hydrocarbons, $C_6$–$C_{18}$ aromatic hydrocarbons, and organic esters, amines and polyamines. Specific solvent species include tetrahydrofuran, hexane, octane, alkyl acetate, tetraglyme and $C_3$–$C_8$ alkanols.

In the metalorganic compound, the metal coordination atom may be coordinated to a β-diketonate ligand. The β-diketonate ligand in such adducts may be of any suitable type, such as 2,2,6,6-tetramethyl-3,5-heptanedionate, sometimes referred to as thd, as well as other β-diketonate ligands, e.g., 1,1,1,2,2,3,3,-heptafluoro-7,7-dimethyloctane-4,6-dionate, hereafter denoted fod; acetylacetonate, hereafter denoted acac and hexafluoroacetylacetonate, hereafter denoted hfac.

As a specific example of precursor compositions useful for forming a Ba—Sr—Ti—O thin film by liquid delivery MOCVD, the barium reagent may comprise Ba(thd)$_2$ (pmdeta), the strontium reagent may comprise Sr(thd)$_2$ (pmdeta) and the titanium reagent may comprise Ti(Oipr)$_2$ (thd)$_2$, with a same solvent medium, a mixture of butyl acetate and pmdeta, being used as the solvent component of the precursor composition for each of such metalorganic reagents. As used in the preceding sentence, "pmdeta" means pentamethyl diethylenetriamine. Other polyamines may be usefully employed as more fully described in U.S. patent application Ser. No. 08/835,768 filed Apr. 8, 1997 in the names of G. Stauf, et al., for "Growth of BaSrTiO$_3$ Using Polyamine-Based Precursors," the disclosure of which hereby is incorporated herein in its entirety.

As an illustration of other source reagents and solvent species that may potentially be usefully employed in the broad practice of the invention, barium source reagents such as Ba(thd)$_2$(tetraglyme) and polyamine adducts, Ba(thd)$_2$ (polyamine), may be used, in compatible solvents. The solvent may be a single-component solvent, or the solvent may be of multicomponent character. For example, the Ba reagent may be Ba(thd)$_2$(tetraglyme) in a solvent such as butyl acetate and tetraglyme, wherein the proportions of butyl acetate and tetraglyme are 85–99% by weight butyl acetate and 1–15% by weight tetraglyme, based on the total weight of the solvent medium, or a Ba(thd)$_2$(polyamine) adduct in a polyamine solvent. Strontium precursor solutions may comprise Sr(thd)$_2$(tetraglyme) in a solvent comprising 75–95% by weight butyl acetate and 5–25% tetraglyme, by weight, based on the total weight of the solvent medium. Zirconium may be provided as the metalorganic precursor Zr(thd)$_4$ in a solution comprising a multicomponent solvent medium containing 45–88% tetrahydrofuran, 10–35% isopropanol and 2–20% tetraglyme, by weight, based on the total weight of the solvent medium. Tin may be provided in various precursor compositions, including Sn(alkyl)$_2$(β-diketonate)$_2$ in butyl acetate, wherein alkyl is $C_1$–$C_{18}$ alkyl; or Sn(β-diketonate)$_2$ in butyl acetate or a solvent mixture of 85–99% butyl acetate and 1–15% tetraglyme, by weight, based on the total weight of the solvent medium; or Sr(thd)$_2$(tetraglyme) in a solvent mixture of 45–98% tetrahydrofuran, and 2–20% tetraglyme, by weight, based on total weight of the solvent medium. Titanium may be provided in the metalorganic compound [O=Ti(thd)$_2$]$_n$, wherein n is one, two or four in butyl acetate; or titanium may be provided in the composition Ti(OiPr)$_2$ (thd)$_2$ in a solvent mixture of 45–88% tetrahydrofuran, 10–35% isopropanol and 2–20% tetraglyme, by weight, based on the total weight of the solvent mixture.

It will be recognized that the foregoing reagent compositions are of an illustrative character, and that a wide variety of respective metal source compounds and complexes, as well as a wide variety of solvent media, may be employed in the broad practice of the invention.

The respective precursor compositions may be combined in a single multicomponent precursor medium as a "cocktail" including all of the metal species to be deposited to form the product high dielectric film, or alternatively, separate precursor compositions may be separately vaporized and the resulting vapor then combined in the manner more fully described in co-pending U.S. patent application Ser. No. 08/758,599 filed Nov. 27 1996 in the names of J. Roeder et al. for "Multiple Vaporizer Reagent Supply System for Chemical Vapor Deposition Utilizing Dissimilar Precursor Compositions," the disclosure of which hereby is incorporated herein by reference in its entirety.

The invention thus contemplates the provision of single as well as multiple vaporizer zones for generating the precursor vapor from the corresponding precursor solution or suspension compositions. Thus, the flash vaporization may be carried out in a single vaporizer, with a single solvent medium being used for each of the respective metal source reagents, or alternatively, multiple vaporizer units may be employed, for flash vaporization of respective precursor solutions or suspensions wherein each respective solution or suspension has a solvent that is selected independently of the others, so that same or different solvent media may be employed in the respective ones of the multiple precursor compositions.

The flash vaporizer zone may be constructed and arranged as more fully described in U.S. Pat. No. 5,536,323 issued Jul. 16, 1996 in the names of Peter S. Kirlin et al., U.S. Pat. No. 5,711,816 issued Jan. 27, 1998 in the names of Peter S. Kirlin et al., and U.S. Pat. No. 5,204,314 issued Apr. 20, 1993 in the names of Peter S. Kirlin et al., the disclosures of which hereby are incorporated herein by reference in their entireties.

The chemical vapor deposition reactor may also be constructed and arranged as more fully described in the incorporated by reference U.S. Patents described in the preceding paragraph. The precursor vapor deriving from flash vaporization of the respected precursors and associated solvent media is carried by a carrier gas into the chemical vapor deposition reactor. The carrier gas may be of any suitable type which is non-deleteriously employed with the precursor vapor. Illustrative of suitable gas species which may potentially be useful in the broad practice of the present invention are argon, nitrogen, helium, ammonia, etc. The carrier gas functions to entrain and mix with the precursor vapor to provide a precursor gas mixture which is transmitted to the chemical vapor deposition chamber. The precursor vapor mixture is mixed in the chemical vapor deposition reactor with an oxidizing co-reactant gas. The oxidizing co-reactant gas may be of any suitable type providing an oxygen-containing environment in which the high dielectric metal oxide film is formed on the substrate. The substrate is suitably retained at desired temperature, in the range of from about 400° C. to about 1200° C., by appropriate heating means, which may for example utilize a resistably heated susceptor structure on which the substrate is mounted, infrared heating means, inductively coupled heating arrangements, or other heat transfer or heat exchange means whereby the substrate is maintained at the desired temperature for deposition on the substrate of the desired high dielectric metal oxide film.

The oxidizing co-reactant gas may comprise oxygen gas (O$_2$), ozone, singlet oxygen, N$_2$O, or other oxic gas, or active oxidizing species, e.g., from a remote plasma source. The chemical vapor deposition reactor is suitably maintained at a pressure of from about 0.1 torr to about 760 torr, and the chemical vapor deposition is carried out for sufficient time to provide growth of the high dielectric film to a desired thickness, as for example a thickness in the range of from about 0.01 micron to about 200 microns. The chemical vapor deposition reactor may be equipped with a showerhead-type distributor for influent gaseous/vapor streams, e.g., a showerhead device of the type described in U.S. patent application Ser. No. 08/402,142 filed Mar. 10, 1995 in the names of Peter C. Van Buskirk et al. for "Showerhead-Type Discharge Assembly for Delivery of Source Reagent Vapor to a Substrate, and CVD Process Utilizing Same" and U.S. patent application Ser. No. 08/621, 088 filed Mar. 22, 1996 in the names of Peter C. Van Buskirk et al. for "Interiorally Partitioned Vapor Injector for Delivery of Source Reagent Vapor Mixtures for Chemical Vapor Deposition," the disclosures of which hereby are incorporated by reference herein in their entireties.

The dielectric film formation process of the present invention enables the production of high dielectric constant films of unexpectedly superior quality, as regards their dielectric constant, low electrical leakage character and their general physical, electrical and morphological properties. The flash vaporization liquid delivery and chemical vapor deposition process of the invention provides close stoichiometric control of dielectric films and is substantially free of premature decomposition of precursor species, such as have plagued prior art film deposition efforts.

The present invention in one aspect provides a novel high Ti (Ba,Sr) titanate composition with favorable dielectric nonlinearity properties. The high Ti (Ba,Sr) titanate film material of the invention achieves a low level of low second order nonlinearities (with $a_2$ coefficients of 100 ppm or lower) simultaneously with the achievement of high dielectric constants (over 100). This is an unexpected result, which has not been seen in bulk materials of similar composition, and enables production of very stable integrated capacitors at high frequency.

In the aforementioned high Ti (Ba,Sr) titanate, at least 60 atom % (of the total metal content) is Ti. The oxide may for example have the nominal composition $(Ba_xSr_yTi_{1-x-y})$-oxide, wherein 1−x−y is in the range of from about 0.65 to about 0.90, with both x and y greater than or equal to 0.05. Ba, Sr and Ti together typically constitute at least 99 atomic percent of the total metal content of the oxide material.

The metal titanate in another embodiment of the invention comprises a (Zr, Sn) titanate which may be used to form a metal titanate film as a dielectric element of a high frequency capacitor, wherein the (Zr, Sn) titanate has the formula: $Zr_{1-x}Sn_xTiO_4$ with x being from 0 to about 0.3; preferably, x is greater than 0 and does not exceed about 0.3. As used herein "titanates" refers to any member of the [Ba, Sr, Ti, O] or [Zr, Sn, Ti, O] families of materials.

The metal titanate in another embodiment of the invention comprises a (Zr,Sn) titanate which may be used to form a metal titanate film as a dielectric element of a dynamic random access memory (DRAM) device. The (Zr,Sn) titanate has the formula: $Zr_xSn_yTi_zO_{4-\delta}$ with x being from about 0.1 to about 0.45, y being from 0 to about 0.6 and z being from about 0.3 to about 0.6. Preferably, y is greater than 0.

The composition range of (Zr,Sn) titanate for the DRAM device was established by pulsed laser deposition using a combinatorial approach. The combinatorial approach utilized an empirically determined figure of merit, $F_m=(\in_r)(\in_o)E_b$, wherein $\in_r$ is the permittivity of the film, $\in_o$ is the permittivity of free space, and $E_b$ is the breakdown field strength. Low leakage in the films of the invention suggests high $E_b$, and concomitant utility at very low film thicknesses where C/A is high, despite the absolute permittivity of the film being lower than that of perovskite BST. The leakage values are lower than are commonly observed at high fields for perovskite BST. As used herein, the term "BST" refers to perovskites having the compositional formula $ABO_3$, wherein A and B are crystallographically inequivalent.

In an illustrative embodiment for forming a thin film capacitor in accordance with the present invention, the titanate film may be deposited on a silicon or other suitable substrate, typically with a sputter-deposited Pt bottom electrode on a $SiO_2$ barrier layer. Ta barriers may also be used but are generally limited in utility to deposition temperatures below about 600° C.

Subsequent to bottom electrode deposition, the titanate is deposited by metal-organic chemical vapor deposition (MOCVD). This deposition method facilitates microstructure control, can be implemented to provide large throughput, can be scaled up to large areas, and provides a conformal deposit. Although the preferred practice of the invention involves formation of the titanate thin film by MOCVD, other deposition techniques (e.g., sputtering, laser ablation, evaporation, or other type of CVD) may usefully be employed.

Barium bis(2,2,6,6-tetramethyl-3,5-heptanedionate) Lewis base adduct (polyamine), referred to as $Ba(thd)_2$, and strontium bis (2,2,6,6-tetramethyl-3,5-heptanedionate) Lewis base adduct (polyamine), referred to as $Sr(thd)_2$, may be usefully employed as Group II metal source reagents. Titanium bis (isopropoxide) bis (2,2,6,6-tetramethyl-3,5-heptanedionate), referred to as $Ti(OCH(CH_3)_2)_2(thd)_2$, may be used as the titanium precursor. Although these compounds are commercially available, they are preferably synthesized by known non-aqueous routes to obtain good stability and purity. Of course, other precursor compounds can be used if desired.

$Ba(thd)_2$ and $Sr(thd)_2$ have a relatively narrow temperature window in which they sublime and remain thermally stable. For this reason, film growth is preferably carried out in an MOCVD reactor fitted with a liquid delivery system that injects the precursor compounds, dissolved in an organic solvent (e.g., n-butyl acetate polyamine), into a hot vaporizer, where they are flash vaporized into an inert carrier gas stream, e.g., of Ar as the carrier gas, for transport to the chemical vapor deposition reactor.

As an illustration of one aspect of a process system for carrying out the method of the invention, as used in empirical work described more fully hereinafter, a commercially available reactor, modified for use with low vapor pressure precursors, and designed to give uniform films over 6 inch diameter substrates, was employed for the chemical vapor deposition step. Such reactor was operated at low pressure (e.g., 700 mTorr), with 500 sccm each of oxygen and nitrous oxide as oxidizers.

Exemplary growth conditions in the aforementioned illustrative reactor are set out in Table I below.

TABLE 1

| Typical CVD growth conditions | |
|---|---|
| Deposition temperature | 540–640° C. |
| Reactor pressure | 700–750 millitorr |
| Deposition rate | 1–6 nanometers/min |
| Substrate | Pt/SiO$_2$/Si |
| Ba delivery rate | 30–50 µmol/min |
| Sr delivery rate | 30–50 µmol/min |
| Ti delivery rate | 30–50 µmol/min |
| Ar flow rate | 200 sccm |
| O$_2$ flow rate | 500 sccm |
| N$_2$O flow rate | 500 sccm |

In such process system, thin film capacitors were made as follows. On a conventional Si wafer (4 or 6 inch diameter) was deposited a $SiO_2$ barrier layer (100–400 nm thick) by conventional wet oxidation over the whole wafer surface. Onto the $SiO_2$ barrier layer was deposited a Pt layer (exemplarily 100 nm thick) by conventional sputtering. The Pt layer also extended over the whole wafer surface and served as the bottom electrode. The sputtering should be carried out in a very clean chamber, since chamber cleanliness is crucial for good adhesion of Pt to $SiO_2$ surfaces, and cleaner chambers and higher bottom Pt deposition temperatures enhance bottom electrode robustness. Onto the Pt layer was deposited a thin film (typically 40 nm) of the titanate according to the invention by MOCVD, as described above. The titanate film also extended over the whole wafer surface. Top electrodes were formed on the titanate layer by e-beam evaporation of about 100 nm Pt through a shadow mask at about 200° C.

After top electrode deposition, the wafers were annealed at 550° C. for 30 minutes in air. The anneal typically resulted in more symmetric I/V characteristics, with lower leakage currents under both positive and negative applied voltages, and in lower dielectric loss.

It will be understood that the above recited conditions are exemplary only, and that other conditions (e.g., different layer thicknesses, different deposition or anneal temperatures, different deposition methods) could be used.

For instance, the top electrode could be Al, in contrast with prior art capacitors with perovskite BST dielectric, which exhibited shorting when Al top electrodes were used. It will also be understood that the described capacitor structure was used for experimental reasons, but that in actual applications the dielectric layer (and possibly also the bottom electrode) would be patterned, exemplarily as schematically shown in FIG. 1, wherein numerals 10–15 refer, respectively, to an integrated (thin film) capacitor, Si substrate, 15 diffusion barrier layer, bottom electrode, titanate dielectric, and top electrode.

Figure 2:
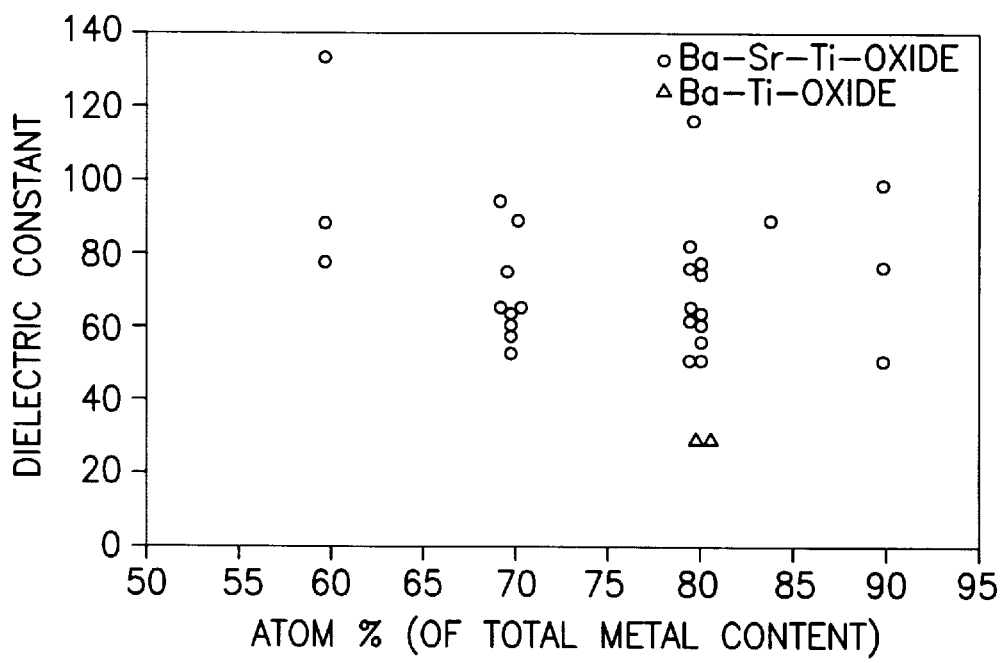
FIGS. 2 and 3 show data on Ba—Sr—Ti—O dielectric constant as a function of mol. % Ti in the dielectric film.

FIG. 2 shows data on dielectric constant K vs. Ti atom %. The circles pertain to high Ti (Ba,Sr) titanate, and the triangles to high Ti (Ba) titanate. As the data show, partial substitution of Sr for some Ba can result in significantly increased dielectric constant. The compositions of FIG. 2 generally have $a_2<100$ ppm/$V^2$, and thus exemplarily can meet the requirements for use in switched capacitor filters. However, the materials corresponding to the data points with less than 60%, or more than 90%, Ti content have relatively large $a_2$, and are generally unsuitable for that reason.

For the sake of clarity, FIG. 2 does not show all data points for the high Ti (Ba,Sr) titanate. We have observed that these compositions exhibit a bimodal distribution with respect to the dielectric constant, but have not yet succeeded in elucidating the reason for this distribution. However, it is anticipated that further research will enable us to eliminate the low-k members of the high Ti (Ba,Sr) titanate compositions.

Figure 3:
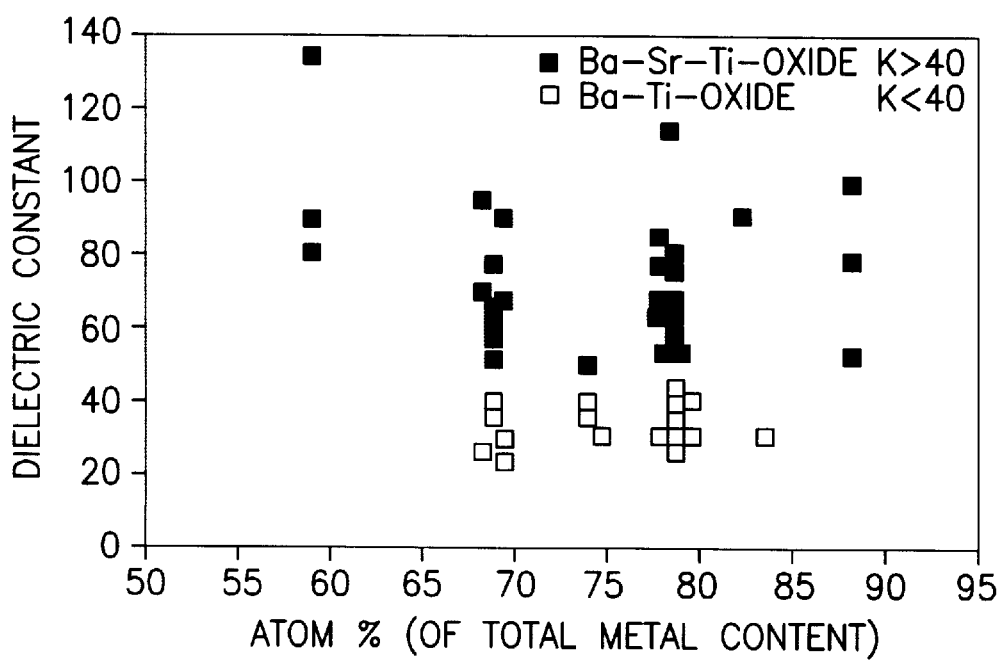

FIG. 3 shows dielectric constant vs. Ti content, for various high Ti (Ba,Sr) titanate samples, and clearly shows the bimodal distribution, with the solid squares pertaining to compositions with k>40, and the open squares pertaining to compositions with k≦40. Selection of samples having k>40 can readily be made using conventional techniques.

Capacitors according to the invention can be used in substantially the same manner in which prior art integrated capacitors are used, taking into account the improved properties. For instance, the higher dielectric constant of capacitors according to the invention facilitates size reduction of the capacitors, resulting in saving of "real estate" on an IC chip.

Figure 4:
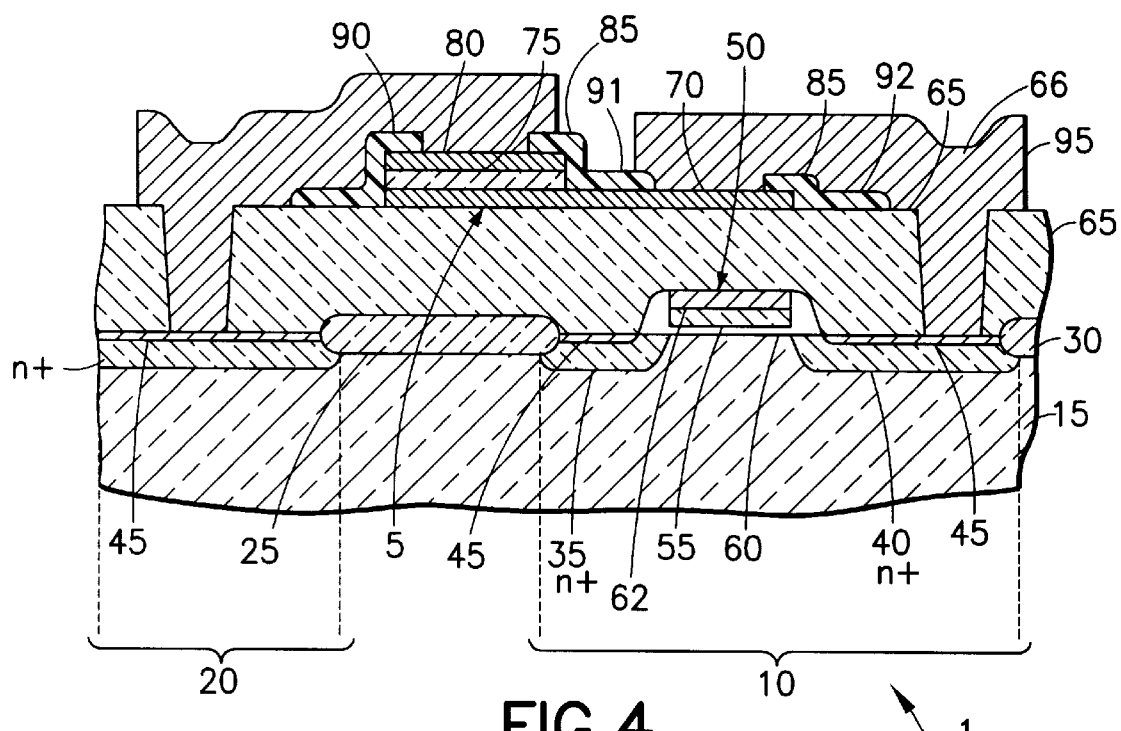
FIG. 4 schematically depicts a portion of an integrated circuit (IC) including an integrated capacitor according to an illustrative embodiment of the invention.

FIG. 4 schematically shows a portion of an exemplary IC with an integral capacitor. The illustrated portion of integrated circuit 1 includes a first active device 10, such as a conventional metal-oxide-semiconductor field effect transistor (MOSFET), and a capacitor 5 employing a dielectric film layer of titanate formed on a substrate 15, such as a silicon substrate. A drain region of a second transistor 20 is also shown. The particular types of active devices employed, e.g., NMOS, PMOS or CMOS, are based on the desired operation of the integrated circuit and are not critical for practicing the present invention. Other suitable active devices include, for example, bipolar junction transistors and GaAs MESFETs. The transistors 10 and 20 can be fabricated, for example, by conventional processing methods. In FIG. 4, the transistors 10 and 20 include field oxide regions 25 and 30 which are formed, for example, by $SiO_2$ and operate as insulators between the transistor 10 and adjacent devices, such as the transistor 20. Source and drain regions 35 and 40 of the transistor 10 are formed by doping with n-type impurities, such as arsenic or phosphorus for NMOS. An optional layer of silicide 45 is deposited over the source and drain regions 35 and 40 to reduce the source and drain resistance, which enables greater current delivery by the transistor 10.

A gate 50 of the transistor 10 includes, for example, polysilicon 55 doped with an n-type impurity, such as by an implant or vapor doping. The gate polysilicon 55 is disposed on a $SiO_2$ spacer 60. An optional layer of silicide 62 is also deposited over the gate polysilicon 55 to reduce the electrical resistance of the gate 50. An insulating layer 65 of, for example, P-glass which is an oxide doped with phosphorus is then deposited on the transistors 10 and 20 to provide protection to the transistors 10 and 20 and to facilitate electrical connection. Contract windows 66 are then etched in the insulting layer 65 to expose the device gate 50 and source and drain regions, such as the regions 35 and 40. Although only the drain regions of the transistors 10 and 20 are exposed in the cross-section of the integrated circuit illustrated in FIG. 4, it should be readily understood that the gate and source are exposed at other areas of the integrated circuit 1 that are outside the illustrated cross-section.

In typical prior art integrated circuit fabrication methods, an electrically conductive interconnection layer would next be deposited on the surface of the insulting layer 65 in specific patterns, to electrically connect devices via the etched regions and other circuit components in the desired manner. However, in accordance with the present invention, at least one capacitor, such as the capacitor 5 shown in FIG. 4, is formed on the integrated circuit, such as on the insulating layer surface.

The capacitor 5 includes a first electrode 70 formed on the insulating layer surface, a dielectric thin film region 75 on the first electrode 70, and a second electrode 80 formed on the dielectric film region 75 opposite the first electrode 70. It is possible for the first electrode 70 to have a two-layer structure. Such a structure is, for example, a layer of platinum formed over a layer of Ti-nitride. Platinum alone is not a suitable electrode material, however, since it adversely chemically reacts with silicon. As a consequence, a diffusion barrier is advantageously employed as the second electrode layer which is in contact with the insulating layer surface, to substantially prevent a chemical reaction between the platinum and the silicon of the substrate 15. Suitable thicknesses for each layer of the two-layer structure are in the range of 0.01 to 0.5 µm.

It is further possible for the first electrode 70 to be a single layer structure of an appropriate conductive material. Overall suitable thicknesses for the first electrode 70, whether a one or two layer structure, are in the range of approximately 0.1 to 0.5 µm.

Thicknesses less than 0.1 µm are undesirable because of its high electrical resistance while thicknesses greater than 0.5 µm are generally disadvantageous because of high fabrication cost and poor adherence. The first electrode 70 is larger than the second electrode 80 to provide electrical connection to the first electrode 70.

In accordance with the present invention, after formation of the capacitor 5, an insulating material 85, such as, for example, $SiO_2$ is deposited on edge regions 90, 91 and 92 of the capacitor 5 to prevent short circuits between the first and second capacitor electrodes 70 and 80 when the interconnection layer is formed. An interconnection layer 95 is then formed on the insulation layer and corresponding etched contact windows to electrically connect the devices 10 and 20 and the capacitor 5 in a desired manner. Suitable materials for the interconnection layer 95 include aluminum and copper. In the integrated circuit 1, the drain 40 of the transistor 10 is electrically connected to the first electrode 70 of the capacitor 80 and the capacitor's second electrode 80 is electrically connected to the source of the transistor 20.

Consistent with the fabrication of the above-described integrated circuit 1, the high Ti (Ba,Sr) titanate and (Zr,Sn) titanate thin film dielectric materials of the invention formed by metal-organic chemical vapor deposition (MOCVD) may be usefully employed in fabricating a wide variety of high frequency capacitors integrated directly onto silicon chips.

Capacitor layers formed directly on a silicon chip provide power conditioning and other functions, replacing off-chip discrete capacitors. Such on-chip capacitor structures achieve a significant advance in the art, inasmuch as lead impedance of discrete devices has become a limiting factor in integrated circuit performance. The on-chip capacitor structures of the invention accommodate the higher clock frequencies and increased use of RF in circuits that are characteristic of current practice in semiconductor integrated circuit manufacturing.

Since Si wafer area is so expensive when processed through a fab, there is strong incentive to make integrated passive devices such as capacitors as small as possible. Perovskite BST is a leading candidate for DRAM dielectric replacement, since it allows some of the highest known C/A (capacitance per unit area) values. The process of the invention enables usage of Ba—Sr—Ti—O or more specifically, high Ti (Ba,Sr) titanate for integrated passive capacitor devices in a highly efficient manner.

The high Ti (Ba,Sr) titanate thin film processes of the invention may be used for fabrication of bypass capacitors, feedthrough capacitors, and switched capacitor filters. As shown in Table II below, each type of capacitor has a somewhat different set of electrical requirements. The high Ti (Ba,Sr) titanate deposition process and resulting thin film, high Ti (Ba,Sr) titanate material of the invention meet the specifications for all three types of capacitor for manufacturing purposes, an important advantage since more han one type of capacitor may be used on a single semiconductor chip.

TABLE II

Representative performance parameters for thin film on-chip switched capacitor filters (SCF), bypass capacitors, and feedthrough capacitors

| Operation at 3 V DC | SCF | Bypass | Feedthrough |
| --- | --- | --- | --- |
| Capacitance density (fF/$\mu m^2$) | >2.5 | >2 | >2 |
| Frequency range | >100 MHz | 2–3 GHz | 2–3 GHz |
| Voltage dependence of K | $a_2$ < 100 ppm | N/A | $a_2$ < 0.3% |
| DC leakage (A/cm$^2$) | <10$^{-4}$ | <10$^{-4}$ | N/A |
| Q factor (inverse of loss) | 100 | 50 | 50 |

The voltage dependence of the dielectric constant, or $a_2$ value, in the above Table I is a second order dielectric nonlinearity as shown in the polynomial equation below.

$$\Delta C/C = a_1 V + a_2 V^2 + \ldots$$

The $a_1$ values (first order nonlinearities) for switched capacitor filters (SCFs) in the foregoing equation can be "compensated out" through design of matched capacitors, but $a_2$ cannot.

Capacitance density, or C/A, values of above 100 fF/$\mu m^2$ have been achieved at 1.6 V in DRAM type BST films, so obtaining at least an order of magnitude better than the 2–2.5 shown in Table II at 3 V for integrated capacitors is not difficult. Similarly, the leakage specification for DRAMs is 10$^{-9}$ A/cm$^2$, so exceeding this is likewise not difficult. The challenges involving BST capacitors relate primarily to nonlinearity ($a_2$ value) and high frequency Q factor specifications. In particular, the $a_2$ coefficient is problematic, since it is inconsistent with the intrinsic property of perovskite BST.

Taking for example the application of BST thin films in the fabrication of voltage tunable devices for phase control and the fabrication of tunable capacitors in microwave circuits, the dielectric constant of BST changes significantly with applied voltage, by up to a factor of 4:1. This corresponds to an $a_1$ coefficient of 400% in the equation above. Since the SCF application described above requires a second order tunability of 100 ppm or less, roughly a factor of 40,000 reduction must be achieved. The high Ti (Ba,Sr) titanate material and process of the present invention satisfy such criteria.

The MOCVD process of the invention for forming high Ti (Ba,Sr) titanate thin film capacitor dielectrics has a number of advantages, including the fact that electrical properties of ferroelectric oxides are extremely dependent on microstructure. An advantage of vapor-phase techniques for forming the high Ti (Ba,Sr) titanate film is the ability to control microstructure, even to the point of producing metastable phases. Additionally, CVD allows throughput appropriate for commercial volume manufacturing.

Another advantage is that CVD offers the possibility of higher oxide deposition rates on larger areas than other commonly used thin film deposition methods such as sputtering, laser ablation and evaporation. Finally, since CVD is a conformal process in contrast to all other thin film deposition techniques, it offers the possibility of extremely high surface area dielectrics, giving very high levels of capacitance per unit volume. DRAM capacitors already make use of this fact, depositing $SiO_2$ dielectric in deep trenches to conserve chip area while retaining large dielectric areas. MOCVD also is acknowledged as the most desirable technique for economical deposition of high quality films over large areas at high throughputs in the semiconductor industry.

Control of the MOCVD process to achieve proper stoichiometry in the high Ti (Ba,Sr) titanate and (Zr,Sn) titanate films of the invention is important for several reasons. The first consideration is the direct effect of the metal ratio, (Ba/Sr) or (Zr/Sn), on the microelectronic properties of the resulting thin film. This is illustrated by perovskite BST in which the addition of Sr lowers the Curie temperature from 120° C. for pure $BaTiO_3$ down to −200° C. for pure $SrTiO_3$. For capacitors it is desirable to operate above the Curie temperature where the material is paraelectric, in order to avoid losses due to the cubic/tetragonal phase change which takes place at the Curie transition. The Ba/Sr ratio in perovskite BST may therefore be adjusted so that the whole operating temperature range of the intended device is above this transition level.

The metal ratio of barium to strontium in high Ti (Ba,Sr) titanate films of the invention, and the metal ratio of Zr to Sn in the (Zr,Sn) titanate films of the invention, may also have to be carefully controlled, since specific ratios may be favorable to the formation of undesirable suboxides which vary the electrical properties of the film, e.g., dielectric constant, resistivity, breakdown voltage, high temperature charge leakage. In some instances, the achievement of specific desired properties may require this ratio to be controlled within 1%, and systematic changes in electrical properties can be seen even with variations of 0.2%.

In order to control stoichiometry in high Ti (Ba,Sr) titanate and (Zr,Sn) titanate thin films in accordance with the present invention, a liquid delivery system is advantageously employed for precursor injection into the MOCVD reactor. By flash vaporizing solutions of organometallic precursors, the liquid delivery and flash vaporization technique avoids the unpredictable precursor decomposition which takes place in bubblers at temperatures high enough to achieve gas phase transport (typically 200° C. or higher). The liquid delivery flash vaporization process enables predictable precursor transport, which is crucial for reproducible films, since electrical properties are stoichiometry dependent.

As an illustrative example of a specific high Ti (Ba,Sr) titanate deposition process system in one embodiment of the invention, a liquid delivery/flash vaporization unit may be integrated with a computer-controlled chemical vapor deposition reactor, such as for example a Watkins-Johnson (WJ) Select 7000 chemical vapor deposition reactor, commercially available from Watkins-Johnson, Inc. (San Jose, Calif.), as modified for use with low vapor pressure precursors. The reactor may for example have a 6" wafer capability and a customized heated showerhead for control of precursors in the temperature window needed to prevent their decomposition.

Figure 5:
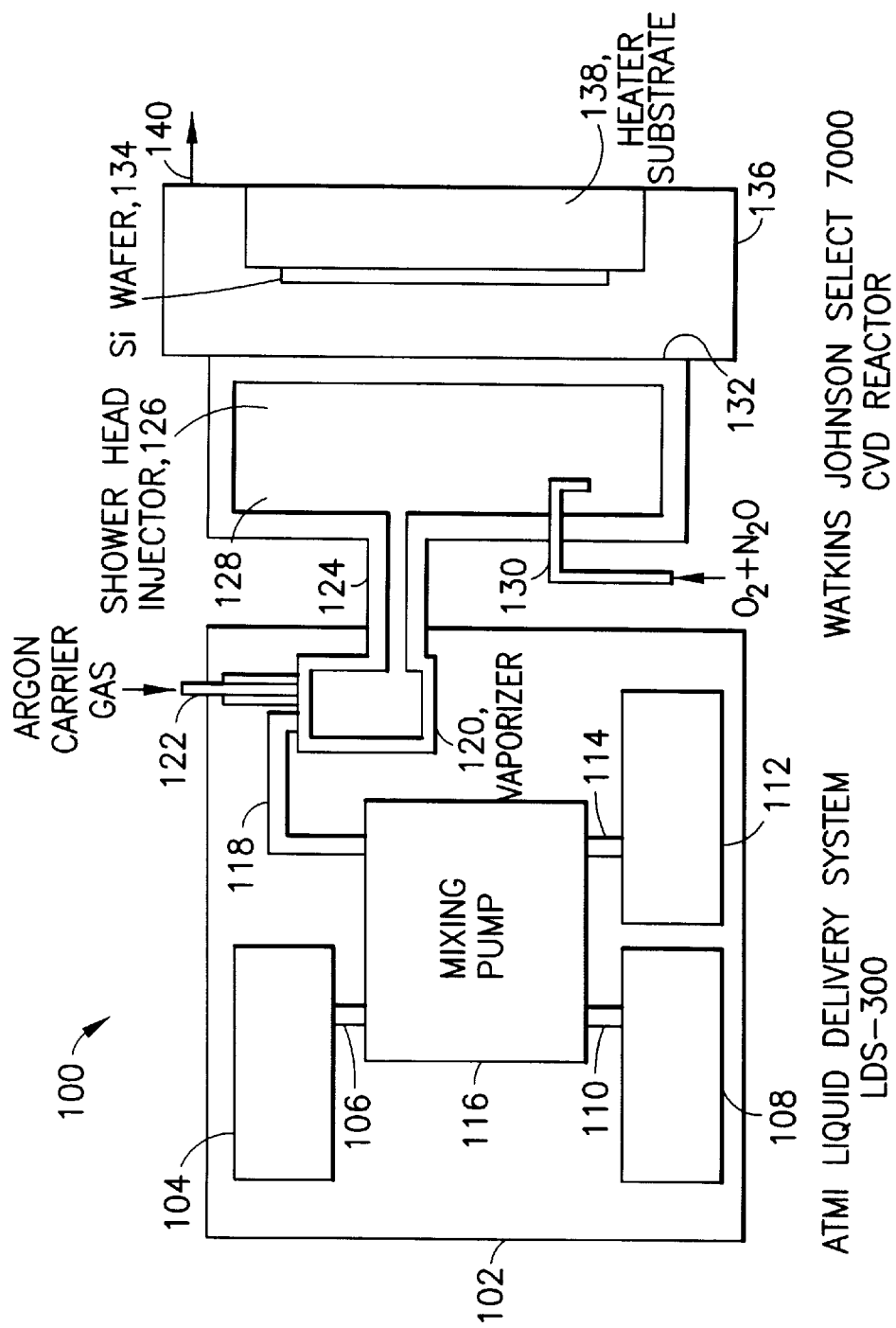
FIG. 5 is a schematic representation of an illustrative liquid delivery, flash vaporization and chemical vapor deposition system that may be employed to form a dielectric film on a substrate in the practice of the invention.

FIG. 5 is a schematic representation of an illustrative liquid delivery, flash vaporization and chemical vapor deposition system 100 of such type. The liquid delivery and flash vaporization assembly 102 may for example comprise an LDS-300 Liquid Delivery System commercially available from Advanced Technology Materials, Inc. (Danbury, Conn.).

In the liquid delivery and flash vaporization assembly 102, the barium, strontium and titanium metalorganic precursors may be provided in respective separate reservoirs 104, 108 and 112 coupled by respective feed lines 106, 110 and 114 with the mixing pump 116. The precursors are each in a suitable liquid solution or liquid suspension, comprising a compatible solvent medium.

As a specific example, polyamine adducts of barium bis(2,2,6,6-tetramethyl-3,5-heptanedionate) (Ba(thd)$_2$) and strontium bis(2,2,6,6-tetramethyl-3,5-heptanedionate) (Sr(thd)$_2$) may be advantageously used as the Group II metal source reagents, while the titanium organometallic precursor may be titanium bis(isopropoxide)bis(2,2,6,6-tetramethyl-3,5-heptanedionate)[Ti(OCH(CH$_3$)$_2$)$_2$(thd)$_2$]. The precursors are mixed in mixing pump 116 and the resulting source mixture of precursors is then flowed in line 118 to the vaporizer unit 120, in which the source mixture of precursors is flash vaporized to form a precursor vapor. The precursor vapor is mixed in the vaporizer unit 120 with a carrier gas, such argon, helium, etc., introduced to the vaporizer unit 120 in carrier gas feed line 122, to form a precursor vapor and carrier gas mixture.

Such vapor/gas mixture is flowed through feed line 124 into the showerhead injector 126. In the interior volume of the showerhead injector 126, the volume/gas mixture from feed line 124 is mixed with oxidizing gas(es), such as oxygen, ozone, N$_2$O, or the like, and the resulting vapor/gas mixture is flowed through egress passages in the front face 132 of the showerhead injector. The egressed vapor/gas mixture flows into the chemical vapor deposition reactor 136 and is impinged on the silicon wafer 134 mounted on substrate heater 138 in the reactor. The substrate heater 138 is energized by suitable means (not shown) such as by an electrical resistance heating structure embedded therein and joined to a suitable power supply, or by being heated by one or more infrared heating lamps, or by being heated by a heating fluid medium flowed through interior passages in the heater, or in any other suitable manner known in the art for heating a substrate element for CVD formation of a film thereon.

The temperature of the substrate element 134, the interior pressure of the reactor 136, the flow rate and relative proportions of the respective Ba, Sr and Ti reagents and the oxygen concentration (partial pressure) are all suitably maintained and controlled to effect the deposition formation of a high (Ba,Sr) titanate film on the substrate element 134.

The deposition process is carried out for sufficient time to yield the desired growth and thickness of the (Ba,Sr) titanate film.

Process effluent gases resulting from the chemical vapor deposition operation are discharged from the reactor 136 in vent line 140, and may be passed to an effluent treatment process facility or other end use or disposition.

Illustrative growth conditions for film growth of high Ti (Ba,Sr) titanate films in a CVD reactor of the foregoing type include the conditions set out in Table I herein earlier.

The use of liquid delivery MOCVD techniques in accordance with the process of the invention permits the achievement of high film growth rates and mixing precision. This approach permits close control and attainment of a wide variety of film stoichiometries, depending on ratios of precursors in the solutions employed in the liquid delivery and flash vaporization operation.

Perovskite BST stoichiometries, are suitable dielectric material forms for use of Ba—Sr—Ti—O for DRAMs, in which maximum possible dielectric constant is essential. Concerning the various stoichiometries of the Ba—Sr—Ti—O material that are possible using the process of the present invention, the preferred high Ti-content (Ba,Sr) titanate material has several advantages. Firstly it is more physically stable, and is more resistant to water and other chemicals, thereby rendering its processing easier. Secondly, a number of low loss/low nonlinearity bulk ceramics exist in the Ba$_4$Ti$_9$O$_{20}$, family of materials, though no stable bulk phases containing significant Sr are known.

The dielectric constants of Ba—Sr—Ti—O films that may be formed in the broad practice of the invention range from 10 to 10,000 depending on composition and microstructure, giving many degrees of freedom for process and material property adjustment.

Characterization of thin film stoichiometry of films produced by the process of the invention may be conducted by x-ray fluorescence spectrometry (XRF). The XRF instrument may be suitably configured for such purpose by addition of fixed channel detectors for quantitative stoichiometry of the metal titanate films, e.g., at a calibrated accuracy and precision of about ±0.2% for the constituent elements in thin films. A scanning electron microscope (SEM) with energy dispersive x-ray attachment (EDAX) may be used for surface roughness examination, estimation of grain sizes, and determination of information relevant to stoichiometry at grain boundaries. An x-ray spectrometer may be used for determination of crystalline orientation, if any, and to estimate crystallite size and degree of perfection. These measurements provide fast feedback on the effect of changes in CVD deposition conditions, stoichiometry, etc. on electrical properties, and may usefully be employed in the practice of the invention to determine suitable process conditions.

Electrical properties of thin films formed in the practice of the invention may be determined using a probe station (e.g., a Wentworth Labs probe station) to make top and bottom contacts for such electrical property measurements. Capacitance and dispersion may be made with a computer-controlled multifrequency impedance analyzer, e.g., an HP 4192A Impedance Analyzer (Hewlett-Packard, Inc., Cupertino, Calif.) capable of measurements up to 13 MHz, while instruments useful for sensitive leakage current measurements include instruments such as the HP4145B Semiconductor Parameter Analyzer and the Kiethley 6517 Electrometer.

The features and advantages of the present invention are more fully illustrated by the following non-limiting examples.

EXAMPLE 1

Capacitor device structures were fabricated using 6" wafers of Pt/ZrO$_2$/ONO/Si (where ONO refers to a standard Si barrier layer of SiO$_2$/SiN/SiO$_2$), or Pt/SiO$_2$Si. A blanket (continuous) underlayer of Pt was used as the bottom electrode in each case, with a tantalum barrier layer between the Si substrate and the Pt bottom electrode. A continuous thin film of high Ti (Ba,Sr) titanate was deposited over this by MOCVD, at a thickness of about 1500 Angstroms, and Pt top electrodes were e-beam evaporated over the high Ti (Ba,Sr) titanate film, in the desired pattern. With exposure of the bottom electrode, this makes a parallel plate capacitor to measure properties of the high Ti (Ba,Sr) titanate dielectric. An anneal step was conducted after deposition of the top electrode to obtain low, reproducible leakage currents in the high Ti (Ba,Sr) titanate film. This was typically carried out at about 500° C. for one hour in air, and provided stress relief.

The best process results in forming bottom electrodes were obtained by depositing Pt at high temperature (around 300° C.) in a very clean system on SiO$_2$ on Si.

A primary aspect of the process of the invention is the achievement of satisfactory $a_2$ coefficients in product high Ti (Ba,Sr) titanate films. One way of reducing $a_2$ coefficient is by reducing high Ti (Ba,Sr) titanate growth temperature, to make the product high Ti (Ba,Sr) titanate films more amorphous, which in turn reduces the dielectric constant from several hundred to about 20. Both first and second order tunability decrease correspondingly.

Figure 6:
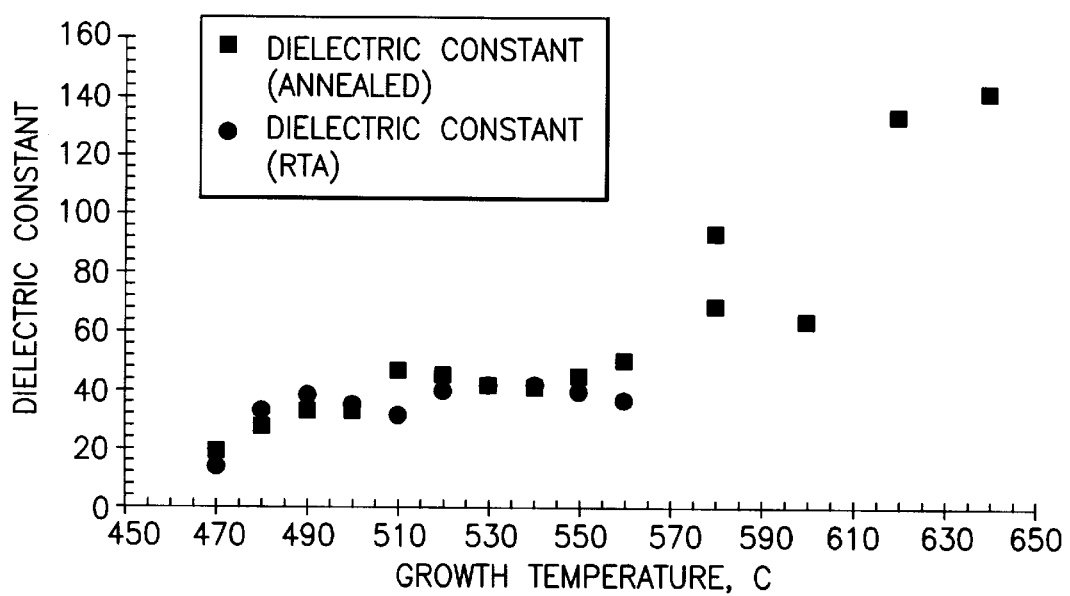
FIG. 6 shows the dielectric constant of BST films plotted as a function of growth temperature.

FIG. 6 shows the dielectric constant of high Ti (Ba,Sr) titanate films plotted as a function of growth temperature. Annealed and RTA refers to the type of anneal (oven anneal and rapid thermal anneal, respectively) performed on the sample after top Pt electrodes were deposited. The high Ti (Ba,Sr) titanate films were ~470 Å thick.

Figure 7:
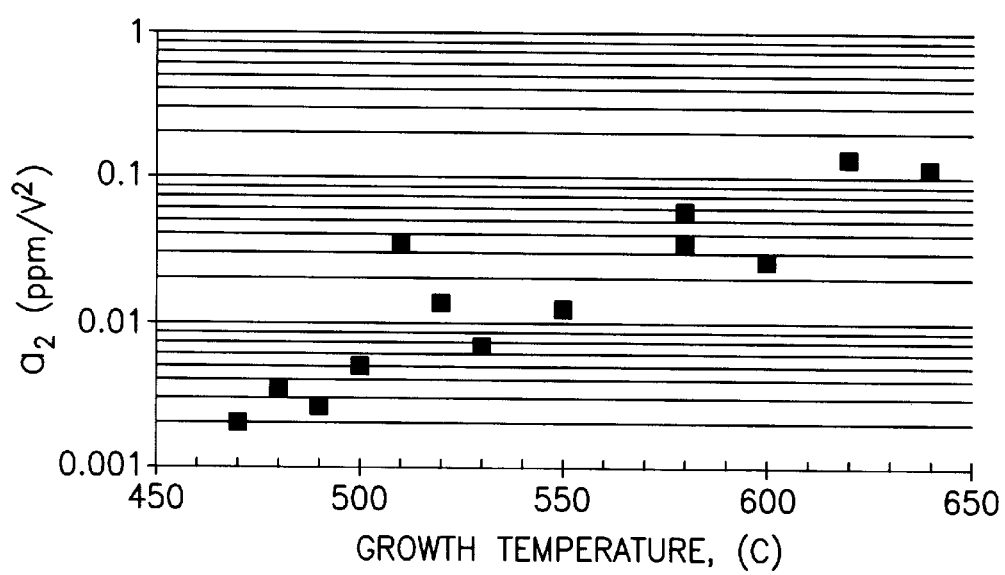
FIG. 7 shows the dielectric $a_2$ parameter (dielectric nonlinearity) as a function of growth temperature for high Ti (Ba,Sr) titanate films ~470 Å thick.

Since lower growth temperatures reduce the dielectric constant in perovskite BST, experiments were performed to examine $a_2$ coefficient for films grown at lower temperatures as well. FIG. 7 shows this $a_2$ parameter (dielectric nonlinearity) as a function of growth temperature for perovskite BST films ~470 Å thick.

EXAMPLE 2

Low temperature Ba—Sr—Ti—O film formation studies were conducted to determine how incorporation of the different film constituents changes with growth temperature, and whether further reduction in growth temperature could be achieved. The effect of growth temperature on precursor incorporation efficiency is shown in FIG. 8.

Figure 8:
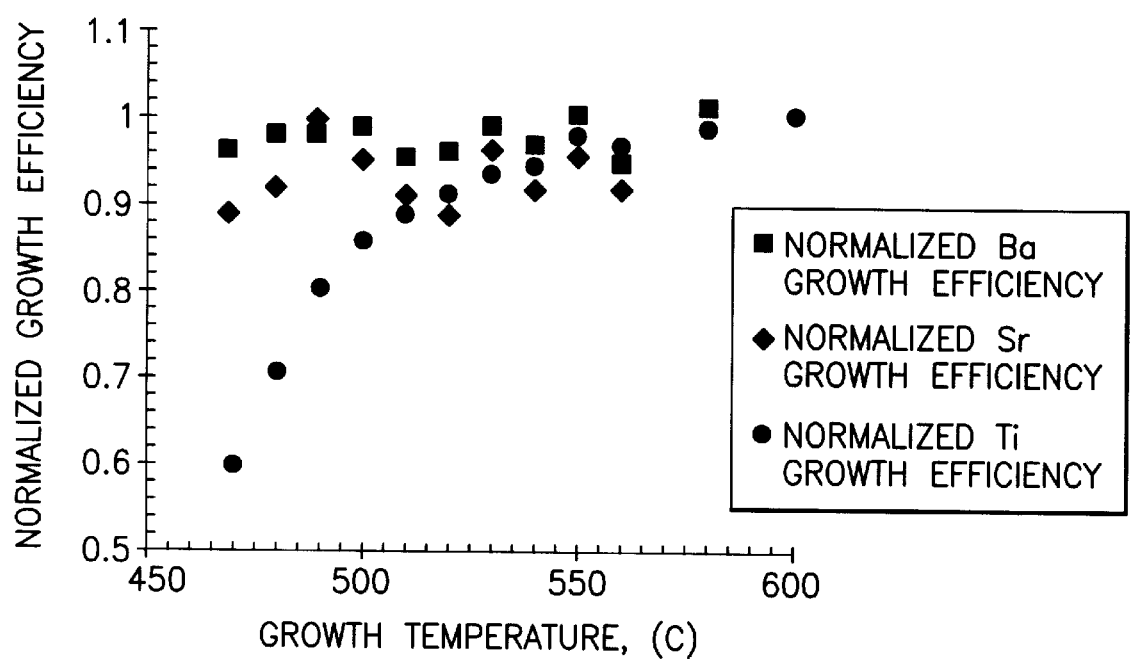
FIG. 8 is a plot of the normalized growth efficiency of Ti, Ba and Sr into high Ti (Ba,Sr) titanate films as a function of growth temperature (normalized to value at 600° C.).

In FIG. 8, the normalized growth efficiency of Ti, Ba and Sr into Ba—Sr—Ti—O films is plotted as a function of growth temperature (normalized to value at 600° C.). Ti incorporation drops off first, below around 550° C., so all films below this temperature were Ti deficient in varying degrees.

It can be seen that compensation via addition of Ti would have to take place for films grown at temperatures below about 550° C. Below about 500° C. incorporation efficiency for all precursors is dropping rapidly, which corresponds to film growth rate reduction. In this temperature regime, it is harder to control composition since the process becomes very temperature sensitive, and it is also more difficult to achieve commercially useful growth rates.

Figure 9:
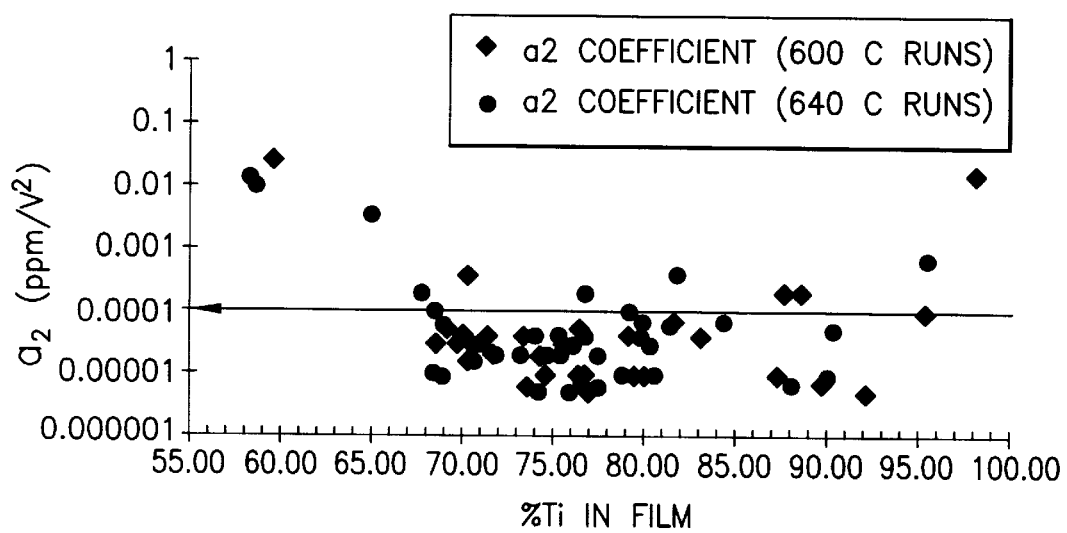
FIG. 9 is a plot of second order nonlinearity, $a_2$, as a function of % Ti in a high Ti (Ba,Sr) titanate film.

As a consequence of the foregoing, compositions with high Ti content were studied. Based on these studies it was determined that there exists an optimal region in % Ti content for high Ti (Ba,Sr) titanate film compositions between 65% and 95% Ti, in which $a_2$ values are consistently below 100 ppm (0.0001). This is shown by the data of FIG. 9, a plot of second order nonlinearity, $a_2$, vs. % Ti in the Ba—Sr—Ti—O. These films all had a 50:50 proportion of Ba:Sr. While there are a few points in the optimal region where $a_2$ is not below 100 ppm, they are all below 400 ppm and thus near the required range for SCF fabrication. The results showed that $a_2$ values below 100 ppm (0.0001) in thin films can be achieved with dielectric constants as high as 140.

Properties of high Ti (Ba,Sr) titanate films were also studied as a function of film thickness at constant growth temperature (640° C.). While the equation for dielectric nonlinearity is presented in terms of voltage, the second order term as a whole is actually a function of electric field. Thus there is thickness dependence of $a_2$, since a particular voltage gives a higher field as dielectric thickness decreases. In fact, $a_2$ varies as a square of thickness, so if all other electrical properties remain the same and film thickness is halved, $a_2$ coefficient should go up by a factor of four.

In these experiments thickness was reduced from around 300 Angstroms where growths had taken place previously, down to around 50 Angstroms, to determine the minimum thickness usable to meet the specifications for device operation, since the thinner the dielectric the higher the storage density of the capacitor. The limiting factor for film thickness may be either leakage ($10^{-4}$ A/cm$^2$) or second order nonlinearity $a_2$ (100 ppm), but empirical measurements showed $a_2$ to be largely independent of thickness.

This data showed that the $a_2$ criteria had been met for all three embedded capacitor applications discussed earlier herein.

In the characterization work, films of the high Ti (Ba,Sr) titanate as thin as 300 Å were studied. Even at fields as high as 1 MV/cm (3 volts across 300 Å), leakages were only on the order of $10^{-6}$ A/cm$^2$, two orders of magnitude below the leakage levels needed for such embedded capacitor applications.

The high Ti (Ba,Sr) titanate films of the invention were characterized as typically having a storage density (C/A) of about 10, with some films having as high as 30 fF/$\mu$m$^2$.

The foregoing results suggest that the high Ti (Ba,Sr) titanate material may be useful for dynamic random access memory (DRAM) applications, in the form of thin films having high breakdown field, $E_b$, low leakage characteristics, and acceptable C/A even though their $\epsilon$ values are lower than those of perovskites.

While the process of the invention has been described with reference to specific features, aspects and embodiments, it will be recognized that the invention is not thus limited, but may be practiced in alternative forms, aspects and embodiments, as will be readily apparent to those of ordinary skill in the art. Accordingly, the invention is to be broadly construed and interpreted to encompass such variations, modifications and other embodiments, within the spirit and scope of the ensuing claims.

What is claimed is:

1. A liquid delivery metal-organic chemical vapor deposition process for forming a dielectric metal titanate film on a substrate, wherein said dielectric metal titanate film has a dielectric constant k>40 and a second order voltage coefficient $a_2$<100 ppm/$V^2$, both measured at 20° C., and said metal titanate film contains at least 60 atom % titanium, said process comprising:

providing a precursor liquid source material including a solution or suspension, comprising a metal-organic precursor and a solvent, for each of the metal components of the metal titanate film;

flash vaporizing the precursor liquid source material at a temperature of from about 100° C. to about 300° C. to form a precursor vapor;

transporting the precursor vapor in a carrier gas to a chemical vapor deposition reactor containing a substrate element;

introducing an oxidant component into the chemical vapor deposition reactor;

contacting the precursor vapor and oxidant component with the substrate element in the chemical vapor deposition reactor at a temperature from about 550° C. to about 1200° C., at a pressure in the chemical vapor deposition reactor of from about 0.1 torr to about 760 torr, to form a dielectric metal titanate film on the substrate element;

wherein said contacting of the precursor vapor and oxidant component with the substrate element is carried out for sufficient time to grow said dielectric metal titanate film on the substrate to a thickness of from about 0.01 μm to about 200 μm, and wherein proportions of each of the metal components of the metal titanate film, temperature of the substrate element in the chemical vapor deposition reactor, pressure in the chemical vapor deposition reactor, delivery rate of said precursor vapor and introduction rate of said oxidant component into the chemical vapor deposition reactor are controlled in relation to one another to yield said dielectric metal titanate film on the substrate having a dielectric constant k>40 and a second order voltage coefficient $a_2$<100 ppm/$V^2$, both measured at 20° C., wherein said metal titanate film contains at least 60 atom % titanium.

2. A process according to claim 1, wherein the metal titanate material of the dielectric metal titanate film comprises a material selected from the group consisting of (Ba,Sr) titanates (Ba—Sr—Ti—O) and (Zr,Sn) titanates.

3. A process according to claim 1, wherein the metal titanate material of the dielectric metal titanate film comprises a (Ba,Sr) titanate (Ba—Sr—Ti—O) material.

4. A process according to claim 3, wherein the (Ba,Sr) titanate has a dielectric constant k>100.

5. A process according to claim 1, wherein the metal titanate material of the dielectric metal titanate film comprises a (Zr,Sn)$TiO_4$ material.

6. A process according to claim 1, wherein pressure in said contacting step is from about 700 to about 750 millitorr.

7. A process according to claim 1, wherein the metal titanate material of the dielectric metal titanate film comprises an oxide of the composition ($Ba_xSr_yTi_{1-x-y}$)-oxide, wherein 1−x−y is in the range of from about 0.65 to about 0.90, and wherein both x and y are greater than or equal to 0.05.

8. A process according to claim 1, wherein the metal titanate material of the dielectric metal titanate film comprises a (Zr,Sn) titanate of the formula: $Zr_{1-x}Sn_xTiO_4$ wherein x is from 0 to about 0.3.

9. A process according to claim 8, wherein x is greater than 0.

10. A process according to claim 1, wherein the metal titanate material of the dielectric metal titanate film comprises a (Zr,Sn) titanate of the formula: $Zr_xSn_yTi_zO_{4-\delta}$ wherein x is from about 0.1 to about 0.45, y is from 0 to about 0.6 and z is from about 0.3 to about 0.6.

11. A process according to claim 10, wherein y is greater than 0.

12. A process according to claim 1, wherein the carrier gas contains at least one gas component selected from the group consisting of argon, nitrogen, helium and ammonia.

13. A process according to claim 1, wherein the oxidant component contains at least one gas selected from the group consisting of $O_2$, $N_2$, O, and $O_3$.

14. A process according to claim 1, wherein the oxidant component comprises an oxidizing species formed by a remote plasma source.

15. A process according to claim 1, wherein the precursor liquid source material comprises metal-organic species provided as metal coordination complexes in which a metal coordination atom is coordinatively bound in a stable complex to two or more ligands of such type, wherein the ligands may be the same as or different from one another.

16. A process according to claim 15, wherein said ligands comprise a ligand selected from the group consisting of β-diketonates, β-ketoiminates, β-diiminates, alkanes, alkenes, cycloalkenes, aryl compounds, alkoxides, and fluorinated derivatives thereof.

17. A process according to claim 1, wherein the precursor liquid source material comprises a solvent selected from the group consisting of glymes, halophatic hydrocarbons, aromatic hydrocarbons, organic ethers, organic esters, alkyl nitriles, alkanols, organic amines, and polyamines.

18. A process according to claim 1, wherein the precursor liquid source material comprises a solvent selected from the group consisting of: glyme solvents having from 1 to 20 ethoxy repeating units, $C_2$–$C_{12}$ alkanols, organic ethers selected from the group consisting of dialkyl ethers comprising $C_1$–$C_6$ alkyl moieties, $C_4$–$C_8$ cyclic ethers, $C_8$–$C_{40}$ crown, $O_1$–$O_{20}$ ethers wherein the prefixed $C_i$ range is the number i of carbon atoms in the ether compound and the suffixed $O_i$ range is the number i of oxygen atoms in the ether compound, $C_6$–$C_{12}$ halophatic hydrocarbons, $C_6$–$C_{18}$ aromatic hydrocarbons, and organic esters, amines and polyamines.

19. A process according to claim 1, wherein the precursor liquid source material comprises a solvent selected from the group consisting of tetrahydrofuran, alkyl acetate, tetraglyme, polyamines and $C_3$–$C_8$ alkanols.

20. A process according to claim 1, wherein the precursor liquid source material comprises a metal-organic compound including a metal coordination atom coordinated to a β-diketonate ligand selected from the group consisting of acac, thd, fod, and hfacac ligands.

21. A process according to claim 1, wherein the precursor liquid source material comprises at least one of:

Ba(thd)$_2$(pmdeta) in a solvent medium comprising butyl acetate and pmdeta;

Ba(thd)$_2$(tetraglyme) in a solvent medium comprising butyl acetate and tetraglyme, wherein the proportions of butyl acetate and tetraglyme are 85–99% by weight butyl acetate and 1–15% by weight tetraglyme, based on the total weight of the solvent medium;

Ba(thd)$_2$(polyamine) in a solvent medium comprising a polyamine;

$Sr(thd)_2$(tetraglyme) in a solvent medium comprising 75–95% by weight isopropanol and 5–25% tetraglyme, by weight, based on the total weight of the solvent medium;

$Sr(thd)_2$(pmdeta) in a solvent medium comprising butyl acetate and pmdeta;

$Zr(thd)_4$ in a solvent medium comprising 45–88% tetrahydrofuran, 10–35% isopropanol and 2–20% tetraglyme, by weight, based on the total weight of the solvent medium;

$Sn(alkyl)_2(\beta\text{-diketonate})_2$ in butyl acetate, wherein alkyl is $C_1$–$C_{18}$ alkyl;

$Sn(acetate)_2$ in butyl acetate or a solvent medium of 85–99% butyl acetate and 1–15% tetraglyme, by weight, based on the total weight of the solvent medium;

$Sr(thd)_2$(tetraglyme) in a solvent medium of 45–88% tetrahydrofuran, 10–35% isopropanol and 2–20% tetraglyme, by weight, based on total weight of the solvent medium;

$Ti(OiPr)_2(thd)_2$ in a solvent medium comprising butyl acetate and pmdeta, wherein OiPr is isopropoxy;

$[O=Ti(thd)_2]_n$ wherein n is one or two, in butyl acetate; and $Ti(OiPr)_2(thd)_2$ in a solvent medium of 45–88% tetrahydrofuran, 10–35% isopropanol and 2–20% tetraglyme, by weight, based on the total weight of the solvent medium.

22. A process according to claim 1, wherein the precursor liquid source material comprises a polyamine as a solvent component thereof.

23. A process according to claim 1, wherein the precursor liquid source material comprises a single solution or suspension including all metal-organic precursor species, and the single solution or suspension is flash vaporized.

24. A process according to claim 1, wherein the precursor liquid source material comprises a separate solution or suspension for each metal-organic precursor species, and wherein each separate solution or suspension is separately flash vaporized and the resulting vapor mixed to form precursor vapor.

25. A process according to claim 1, wherein said dielectric metal titanate film is grown on the substrate at a rate of from about 1 to about 6 nanometers per minute.

26. A process according to claim 1, wherein temperature in said contacting step is from about 550° C. to about 640° C.

* * * * *